US 7,499,619 B2
(45) Date of Patent: Mar. 3, 2009

(12) United States Patent
Hyde

(10) Patent No.: US 7,499,619 B2

(54) PHOTONIC CRYSTAL ENERGY CONVERTER

(75) Inventor: Roderick A. Hyde, Livermore, CA (US)

(73) Assignee: Searete

( * ) Notice: Subject to any disclaimer, the term of this patent is extended or adjusted under 35 U.S.C. 154(b) by 0 days.

(21) Appl. No.: 11/904,472

(22) Filed: Sep. 26, 2007

(65) Prior Publication Data

US 2008/0025666 A1 Jan. 31, 2008

Related U.S. Application Data

(63) Continuation-in-part of application No. 11/003,577, filed on Dec. 3, 2004, now Pat. No. 7,333,705.

(51) Int. Cl.
G02B 6/10 (2006.01)
G02B 6/26 (2006.01)

(52) U.S. Cl. .................. 385/129; 385/31; 385/39; 385/44; 385/130; 385/131; 385/122

(58) Field of Classification Search .................. 385/11, 385/14, 40, 31, 129, 130, 131, 122, 141, 385/49, 39, 44, 140
See application file for complete search history.

(56) References Cited

U.S. PATENT DOCUMENTS

| 6,470,127 | B2 | 10/2002 | Voevodkin | |
| 6,538,191 | B1 | 3/2003 | MacDonald | |
| 6,603,911 | B2 | 8/2003 | Fink et al. | |
| 6,744,960 | B2 | 6/2004 | Pelka | |
| 6,784,603 | B2 | 8/2004 | Pelka et al. | |
| 6,819,845 | B2 * | 11/2004 | Lee et al. | 385/122 |
| 6,928,099 | B2 * | 8/2005 | Ledentsov et al. | 372/97 |
| 7,123,804 | B2 * | 10/2006 | Baba et al. | 385/129 |
| 7,333,705 | B2 * | 2/2008 | Hyde | 385/129 |
| 2003/0128922 | A1 * | 7/2003 | Kolodziejski et al. | 385/27 |
| 2004/0126072 | A1 * | 7/2004 | Hoon Lee et al. | 385/122 |
| 2005/0180680 | A1 * | 8/2005 | Kong | 385/14 |
| 2006/0120679 | A1 * | 6/2006 | Hyde | 385/129 |

OTHER PUBLICATIONS

Berkeley Lab; "An Unexpected Discovery Could Yield A Full Spectrum Solar Cell"; Reasearch News; bearing a date of Nov. 18, 2002; pp. 1-5; located at: http://www.lbl.gov/Science-Articles/Archive/MSD-full-spectrum-solar-cell.html; printed on Dec. 3, 2004.
Divliansky, Ivan; Mayer, Theresa; Holliday, Kito S.; Crespi, Vincent H.; "Fabrication of Three-Dimensional Polymer Photonic Crystal Structures Using Single Diffraction Element Interference Lithography"; Applied Physics Letters; bearing a date of Mar. 17, 2003; vol. 82, No. 11; pp. 1667-1669.
Spectrolab; "Spectrolab Terrestrial Concentrator Solar Cell Achieves Unparalleled Solar Energy Conversion"; bearing a date of Jul. 25, 2003; pp. 1-2; located at : http://www.spectrolab.com/com/news/news-detail.asp?id=152; printed on Dec. 3, 2004.

* cited by examiner

*Primary Examiner*—Brian M Healy

(57) ABSTRACT

A photonic crystal is configured with wavelength converting material to act as a concentrator for electromagnetic energy. The concentrator may also be configured with energy conversion devices to convert the electromagnetic energy into another form of energy.

25 Claims, 10 Drawing Sheets

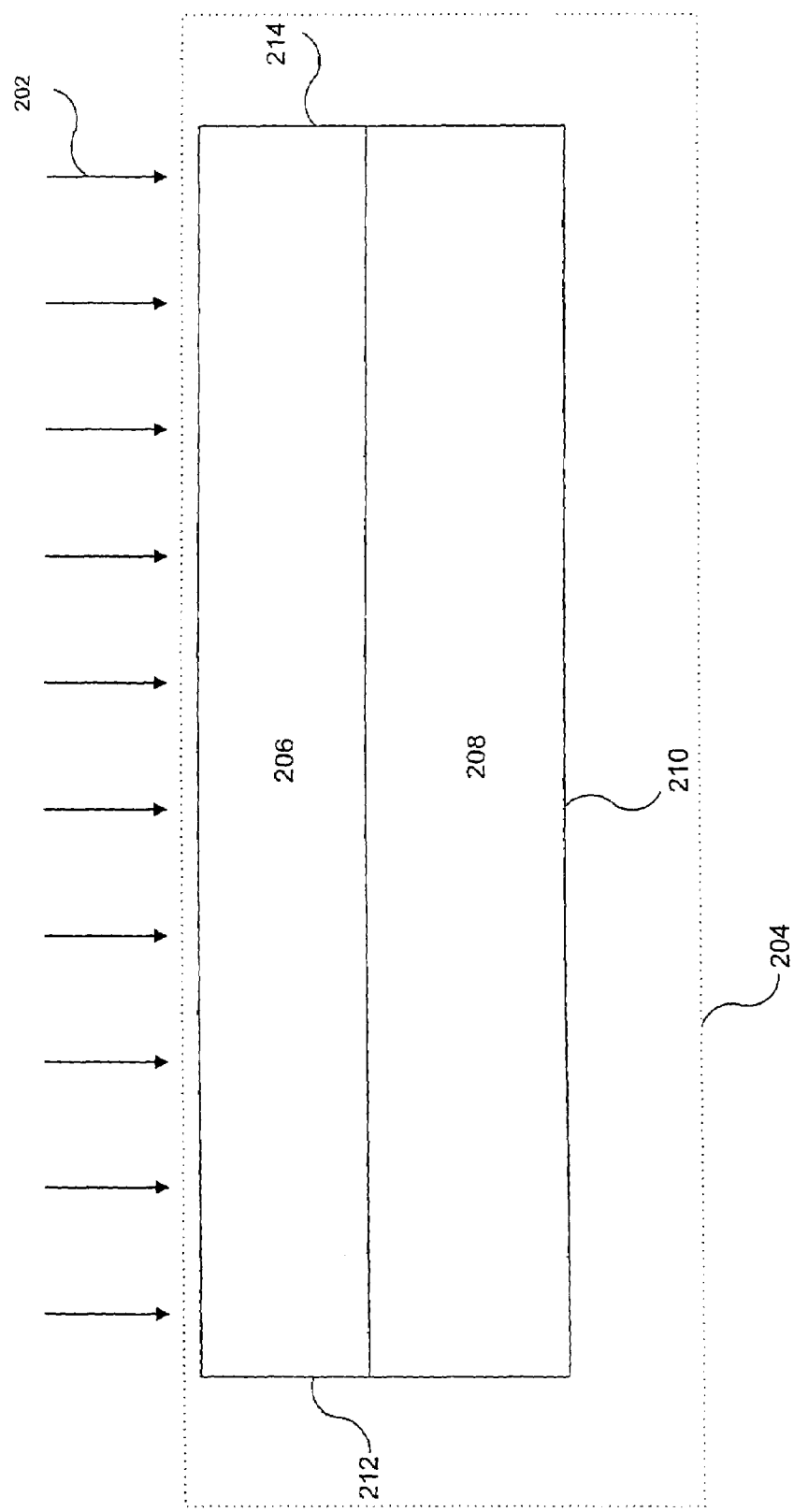

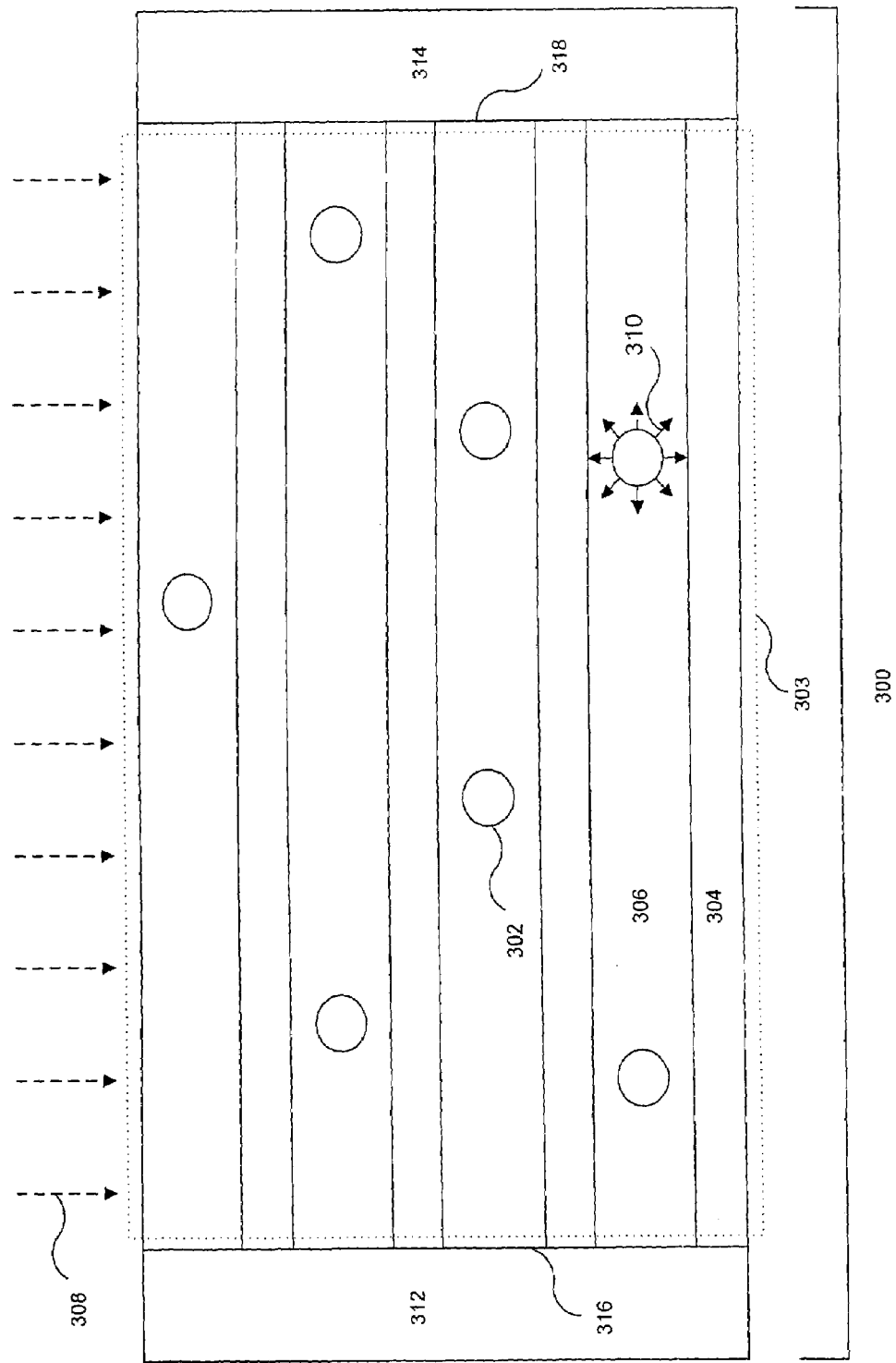

FIG. 7
FIG. 7A
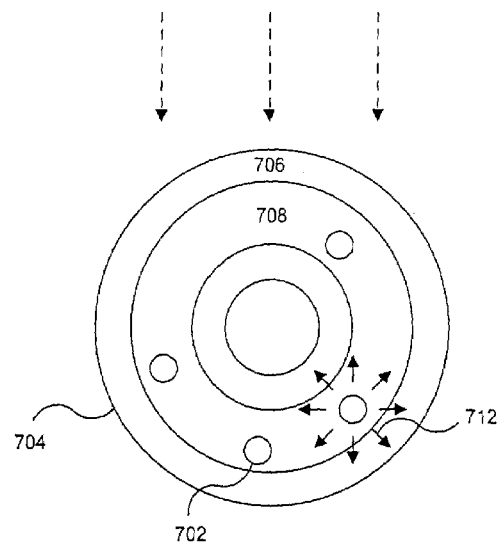
FIG. 7B
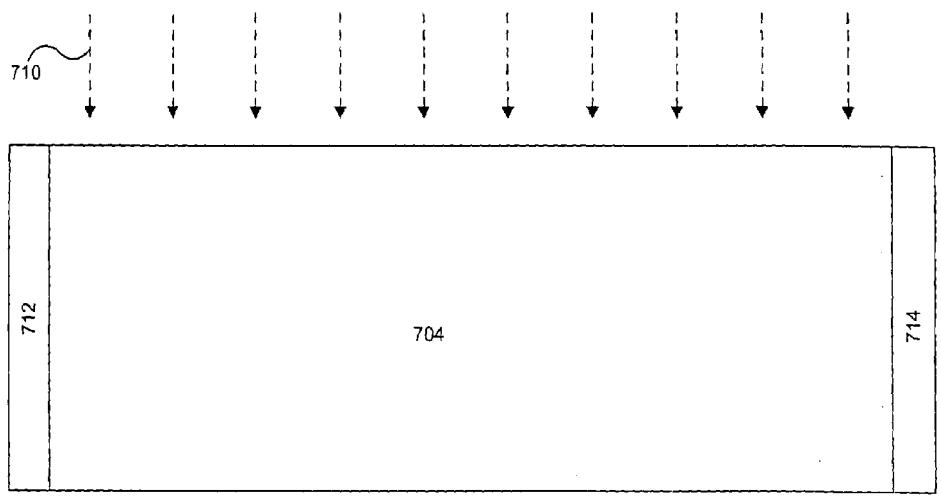

PHOTONIC CRYSTAL ENERGY CONVERTER

For purposes of the USPTO extra-statutory requirements, the present application constitutes a continuation-in-part of U.S. Pat. application Ser. No. 11/003,577, entitled PHOTONIC CRYSTAL ENERGY CONVERTER, naming Roderick A. Hyde as inventor, filed 3 Dec. 2004, now U.S. Pat. No. 7,333,705 which is currently co-pending, or is an application of which a currently co-pending application is entitled to the benefit of the filing date.

TECHNICAL FIELD

The present application relates, in general, to photonic crystals and concentrators of electromagnetic energy.

BACKGROUND

One example of an energy conversion device having fluorescent concentrators is found in U.S. Pat. No. 6,538,191 to Stuart, entitled PHOTOCELL WITH FLUORESCENT CONVERSION LAYER, which is incorporated herein by reference. Typically, an energy conversion device having a fluorescent concentrator includes a top layer of material that is transparent to light, a bottom layer, and fluorophores that are distributed in the volume of the structure. These components, forming the fluorescent concentrator, are arranged such that light rays that are incident on the top surface of the structure reach the fluorophores. The fluorophores absorb the light and re-emit it at a different wavelength. The light rays that are emitted by the fluorophores then propagate to the edges of the fluorescent concentrator. The structure is typically large to collect a lot of light, and strips of solar cells are placed at the edges of the fluorescent concentrator and convert the fluorescence into electrical energy.

The concentrator depends on total internal reflection of the fluorescence for it to reach the edges of the fluorescent concentrator, and since the fluorescence may be absorbed and re-emitted many times by the fluorophores in the concentrator and fluorescent emission occurs at all angles with respect to the surface of the structure, this can contribute to large losses in the concentrator.

Another way of constructing a concentrator for electromagnetic energy is to use photonic band-gap materials instead of traditional dielectrics for the structure. In these materials, radiation in a certain range of frequencies does not propagate, so they transmit a wide range of frequencies (pass-band) while prohibiting other frequencies. FIG. 1 shows a band-gap diagram for a typical photonic band-gap structure. Plotted is frequency ω 102 versus wave vector k 104. For this structure there is a photonic band-gap 106 and in this range of frequencies radiation does not propagate. Light in frequency ranges above and below the band-gap 106 propagates within the photonic crystal. Photonic crystals may have more than one band-gap and pass-band.

SUMMARY

A photonic crystal may be configured with wavelength converting material (usually fluorophores) to create a concentrator. In one embodiment, the concentrator directs electromagnetic radiation to energy conversion devices. In one embodiment, the photonic crystal may be a one-dimensional photonic crystal, and may be configured as an omnidirectional multilayer reflector. In another embodiment, the photonic crystal may be configured as a waveguide, possibly with one or more energy conversion devices at one or both ends of the waveguide.

BRIEF DESCRIPTION OF THE FIGURES

FIG. 2 is a diagram showing light rays incident on a concentrator comprising a photonic crystal and a wavelength converting material.

FIG. 3a is a diagram showing a cross-section of an energy conversion device with a concentrator having a multi-layered structure.

FIG. 3b is a diagram showing the band-gap structure for a device such as that of FIG. 3a.

FIG. 7 is a diagram showing a cross-sectional view and a side view of a waveguide concentrator.

DETAILED DESCRIPTION

Figure 1:
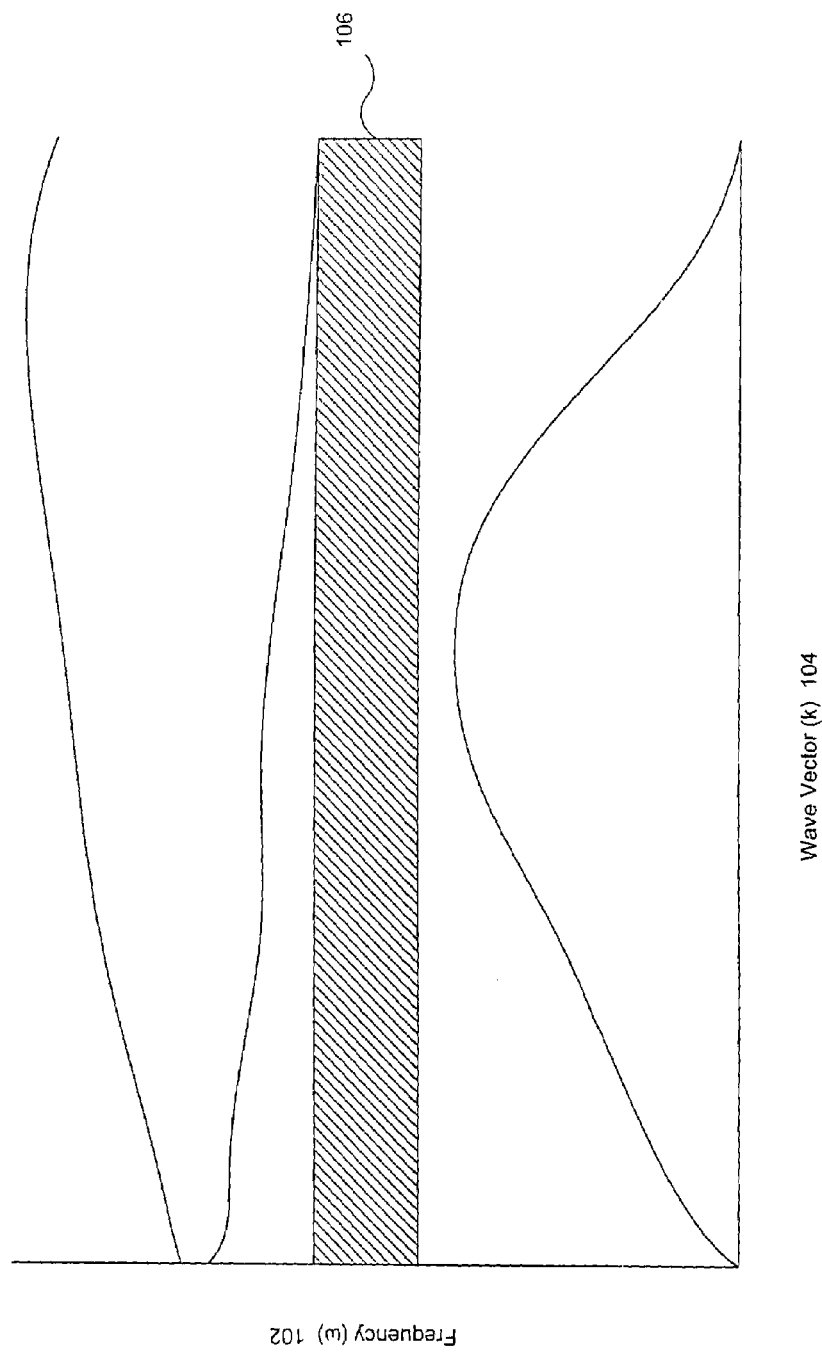
FIG. 1 is a diagram showing the band-gap structure of a typical photonic band-gap material.

In an embodiment of a system, shown in FIG. 2, light 202 enters a concentrator 204. A portion of the light 202 with wavelengths outside a band-gap 106 passes through a photonic crystal segment 206 and enters a wavelength converting material 208. The photonic crystal segment may be of a photonic crystal material such as that described previously, or may be another photonic material, including a man-made material, as will be described in more detail herein.

Within the wavelength converting material 208 a portion of the light is converted to a different wavelength, for example by absorption and fluorescent re-emission. Converted photons with frequencies within the band-gap 106 are blocked by the photonic crystal segment 206 from traveling back through the photonic crystal segment 206. Converted photons can be prevented from escaping through surface 210 by a variety of methods, including a reflector, a total-internal-reflection dielectric interface, a photonic crystal material, such as material of a type similar to the material of the photonic crystal segment 206. In other approaches the photon travel may be precluded or controlled according to other types of structures, or geometries, such as to geometry of FIG. 7, rather than through a dedicated blocking surface 210. The emission photons can propagate in one or more lateral directions toward energy conversion devices at surfaces 212 or 214. The photons may be guided through waveguides, or other optical structures, or may travel free of specific waveguides.

Figure 3B:
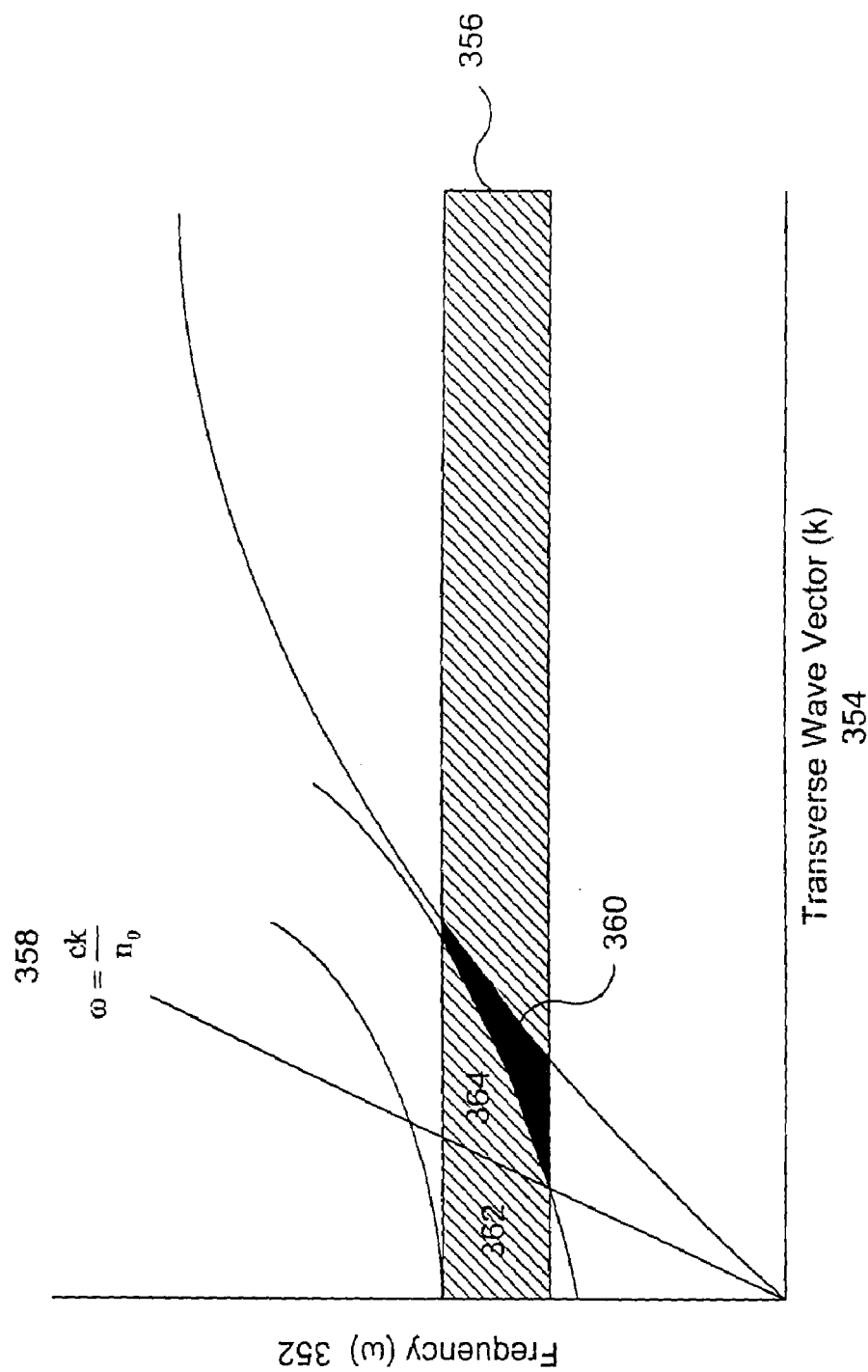

In a second embodiment, shown in FIG. 3a, wavelength converting material 302 is patterned in a multi-layered structure 303 comprising alternating layers of a first dielectric material 304 and a second dielectric material 306. The dielectric constants and thicknesses of the layers are chosen such that the multi-layered structure 303, which acts as the concentrator, forms a dielectric omnidirectional reflector, as described in Fink, Winn, Fan, Chen, Michel, Joannopoulos, and Thomas, "A Dielectric Omnidirectional Reflector", Science, Volume 282, Nov. 27, 1998, 1679, which is incorporated herein by reference. The type of photonic crystal described therein utilizes one-dimensional, multi-layer structures rather than two-dimensional or three-dimensional structures. In such photonic crystals, the band-gap 106 is generally partial, not complete; such that light with low transverse wavenumbers is blocked, but light with higher wavenumbers propagates. This band structure, illustrated in FIG. 3b, permits internal confinement, in which all light 362 that can propagate in an external environment lies within the forbidden portion of the band-gap, while some or all of light 360 with larger wavenumbers can propagate within the photonic crystal.

While the embodiment described in FIG. 2 presented a single layer photonic crystal, structures having two or more layers of photonic crystals can be utilized within a photonic crystal energy converter in the same fashion as the full-band-gap photonic crystals described in FIG. 2.

In another approach, such embodiments having two or more layers can be implemented according to a second embodiment, shown in FIG. 3a. Here, the wavelength converting material is embedded within a multilayer photonic crystal. This arrangement modifies the emission characteristics of the wavelength converting material to emit photons only in permitted portions 360 of the band-gap. The modified emission characteristics of the photons means that substantially all photons 362 that could potentially escape to and propagate in the external environment are not created. Light rays 308 incident on the multi-layered structure 303 having a frequency outside the band-gap 356 are transmitted through the multi-layered structure 303 and a portion of this light is absorbed by the wavelength converting material 302. Light 310 that is subsequently emitted by the wavelength converting material at frequencies 360 within the band-gap cannot propagate outside the multi-layered structure 303 and so travels to the edges 316, 318 where the light 310 may be converted to another form of energy by energy conversion devices 312 and 314.

Although the light 308 incident on the concentrator 303 is shown as having a direction normal to the interface, this is not a requirement and incoming radiation having any direction vector with respect to the normal of the interface may be transmitted through the concentrator 303. In some embodiments the band-gap 106 of the photonic crystal may depend on the angle that the direction vector of radiation makes with the normal to the photonic crystal interface, and in some embodiments, the band-gap may depend on the polarization of the radiation. Further, the embodiment in FIG. 3a does not require that the structure be rectilinear, and the structure may be a different shape than that shown in the figure.

The energy conversion devices 312, 314 shown in FIG. 3a, in one embodiment, may be photovoltaic cells configured to convert electromagnetic energy into electrical energy. The devices 312, 314 may include one or more photodiodes or other photoelectric devices, and the photoelectric device may be silicon-based. The device may be configured to be responsive to the full spectrum of electromagnetic energy. The device may include gallium or indium, or indium nitride. The device may be configured such that it has a plurality of junctions to receive electromagnetic energy from multiple input ports or to send energy out of multiple output ports. For a device with multiple junctions, the device may be such that each junction responds to a different central wavelength.

Figure 4:
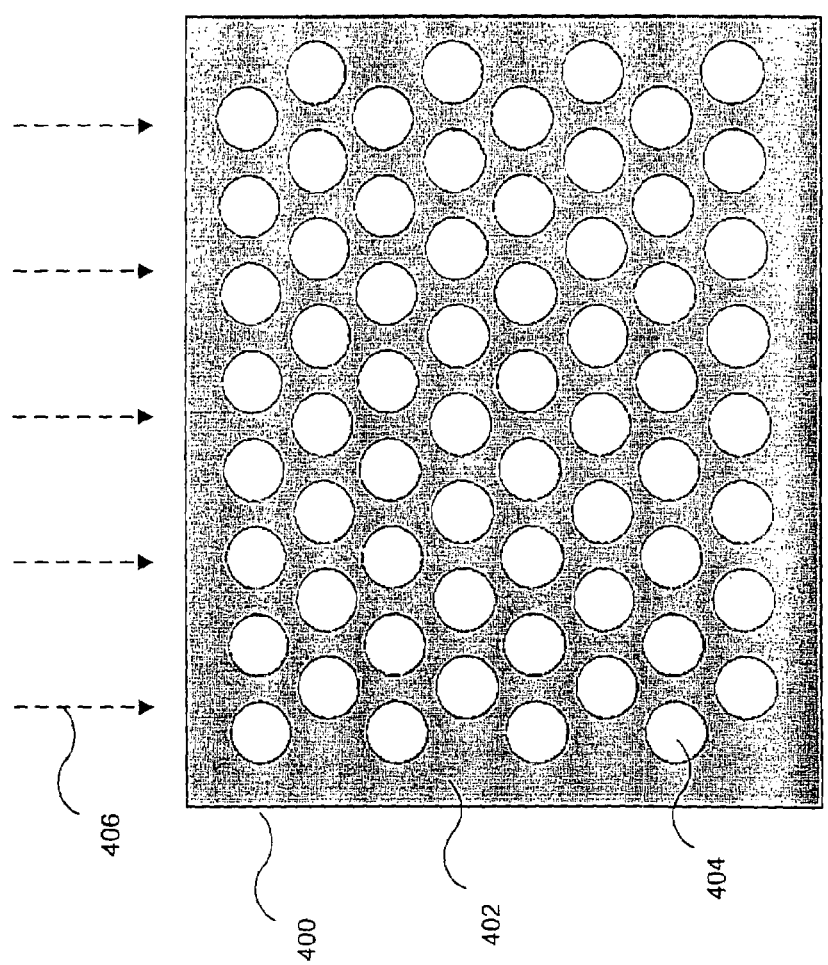
FIG. 4 is a diagram showing a photonic crystal structure.

The embodiment in FIG. 3a describes a dielectric multilayered structure having alternating layers of a first dielectric material and a second dielectric material. In other embodiments other types of photonic crystals are possible. For example, FIG. 4 shows a cross-section of a two-dimensional photonic crystal 400 that is fabricated by patterning holes 404 in a dielectric 402. This structure has a photonic band-gap for light rays 406 propagating in the plane of the structure.

Figure 5:
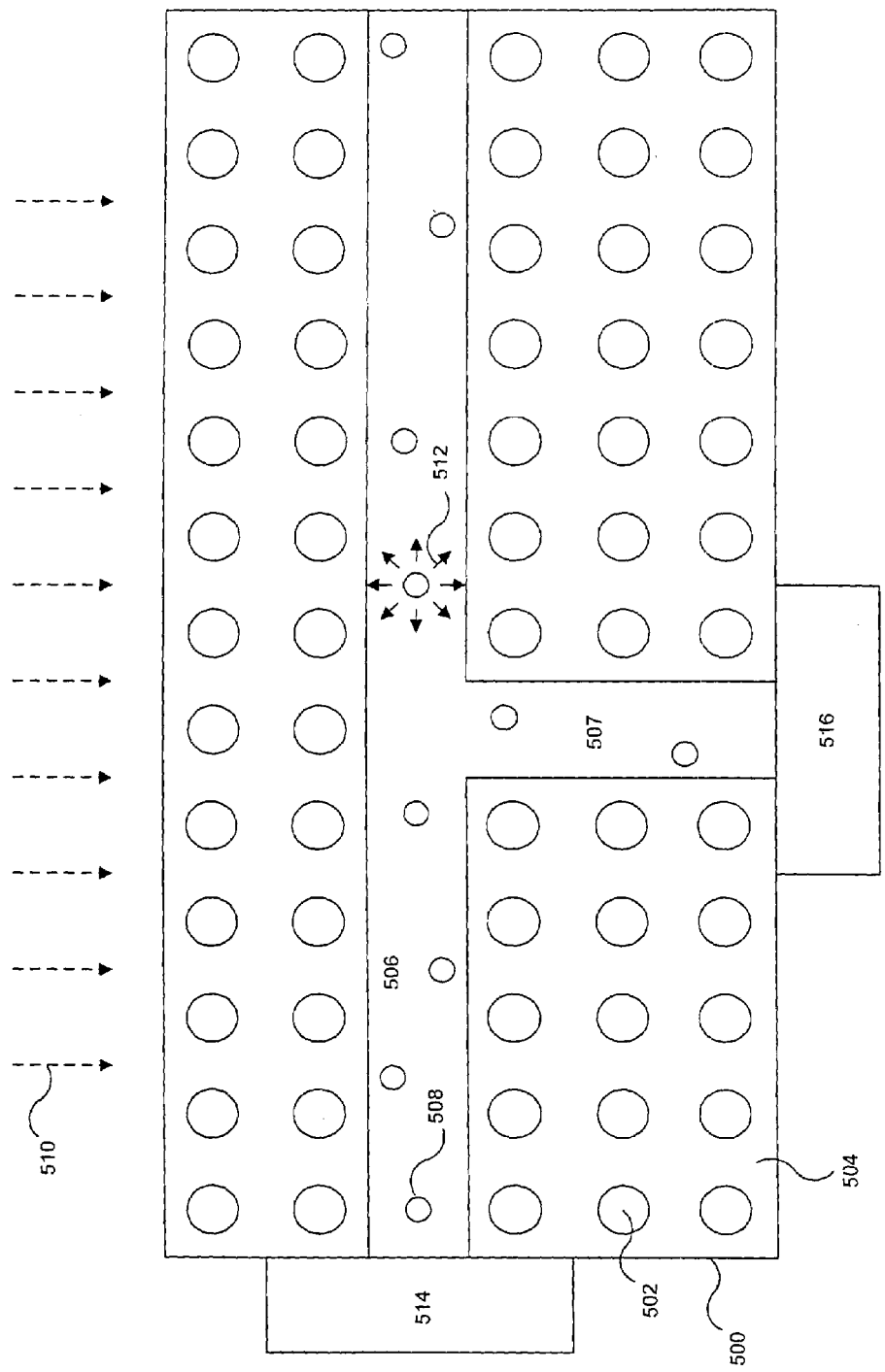
FIG. 5 is a diagram showing a photonic crystal structure having waveguides.

In the embodiment shown in FIG. 5, the photonic crystal 500 comprises holes 502 patterned in a dielectric material 504. The photonic crystal 500 is configured to have two intersecting waveguides 506 and 507 with wavelength converting material 508 in the waveguides 506 and 507. The wavelength converting material 508 absorbs incident radiation 510 and subsequently emits radiation 512 that is guided to energy conversion devices 514 and 516 by the waveguides 506 and 507. Two intersecting waveguides 506 and 507 are shown by example in FIG. 5, but the device may be configured with a different number of waveguides in a pattern different from that shown in FIG. 5 depending on the particular design. These waveguides may intersect or not, and they may meet at a common energy conversion device or they may each terminate at a different energy conversion device according to the design. Further, although FIG. 2 and FIG. 3a are shown without waveguides, any of the photonic crystal structures may incorporate one or more waveguides to facilitate the transport of electromagnetic energy.

The embodiment shown in FIG. 5 demonstrates a photonic crystal formed by patterning holes in a dielectric material. Many other ways of fabricating photonic crystals are known to those in the art, including ways of making fully three-dimensional photonic crystals having a band-gap in three dimensions. One such method is described in Divliansky, Mayer, Holliday, and Crespi, "Fabrication of three dimensional polymer photonic crystal structures using single diffraction element interference lithography", Applied Physics Letters, Volume 82, Mar. 17, 2003, 1667, which is incorporated herein by reference. Further, photonic crystals having dynamically alterable properties may be constructed by creating a photonic crystal with electro-optic and/or acousto-optic materials.

In one embodiment, fluorophores may be used as the wavelength converting material, and, specifically, quantum dots may be used as fluorophores in concentrators as described, for example, in U.S. Pat. No. 6,744,960 entitled LIGHTING APPARATUS HAVING QUANTUM DOT LAYER which is incorporated herein by reference. In another embodiment, the fluorophores may be organic fluorescent dyes. Fluorescent dyes are described in U.S. Pat. No. 6,784,603 entitled FLUORESCENT LIGHTING APPARATUS which is incorporated herein by reference. The wavelength converting material 302, 508 may be incorporated into the photonic crystal in a multitude of ways. One or more of the materials that form the photonic crystal may be doped with wavelength converting material, effectively creating a photonic crystal with a substantially even distribution of wavelength converting material throughout the material or materials that are doped. In the case of the multilayer structure shown in FIG. 3a, the wavelength converting material may be deposited between the layers. Although the embodiments described above show one kind of wavelength converting material, it is possible that other embodiments include more than one kind of wavelength converting material having different absorption and emission spectra, including different sizes of quantum dots, or a mixture of quantum dots and organic fluorescent dyes, for example. In the case of more than one kind of wavelength converting material, the wavelength converting materials may be mixed (for example, a material may be doped with two kinds of fluorophore), or the wavelength converting materials may exist in discrete sections. The wavelength converting material may be chosen such that its absorption spectrum overlaps with a selected portion of the solar spectrum.

The wavelength conversion achieved by the wavelength converting material may depend on the particular properties of the wavelength converting material. The wavelength band and the amount of electromagnetic energy absorbed and emitted by the wavelength converting material may depend on the particular material and, possibly, on the particular configuration of the wavelength converting material.

Figure 6:
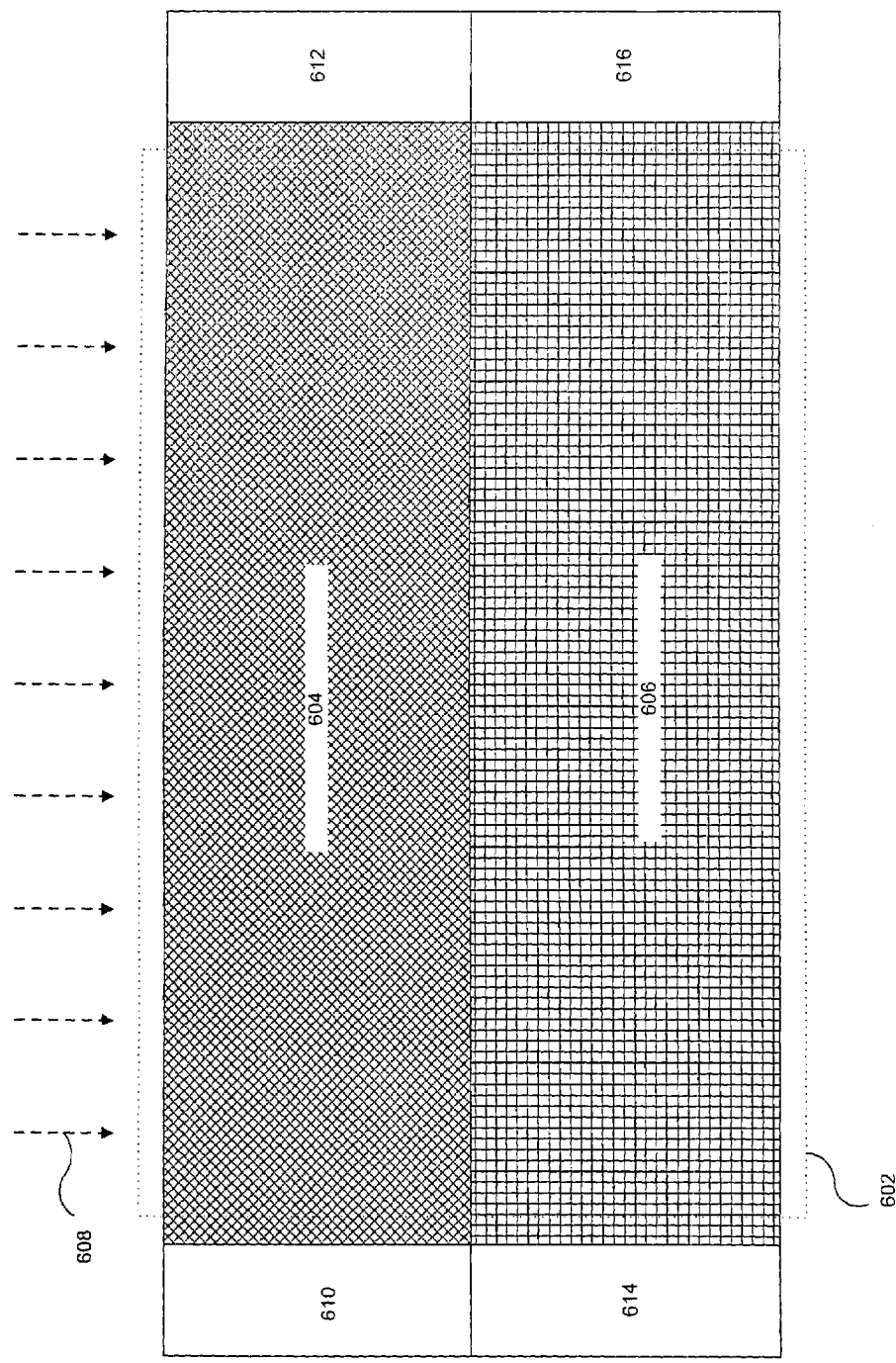
FIG. 6 is a diagram showing two different stacked photonic crystals.

In an embodiment shown in FIG. 6, the concentrator 602 includes two different stacked photonic crystals, 604 and 606. The first photonic crystal 604 is doped with wavelength converting material (not shown) having a first absorption and emission spectrum, and the second photonic crystal 606 is doped with wavelength converting material (not shown) having a second absorption and emission spectrum. Light corresponding to the first absorption spectrum passes through the first photonic crystal and a portion of this light is absorbed by the wavelength converting material in the first photonic crystal 604. Light corresponding to the second absorption spectrum passes through both the first and the second photonic crystal and is absorbed by the wavelength converting material in the second photonic crystal 606. Light that is emitted by the wavelength converting material travels to the energy conversion devices (610, 612, 614, and 616) positioned at the edge of each photonic crystal. The embodiment shown in FIG. 6 includes two different kinds of photonic crystals, however other embodiments may include three or more different photonic crystals. Each photonic crystal may or may not include wavelength converting material, and the layers may have the same or two or more different kinds of wavelength converting materials. The stacked photonic crystals need not overlap one another completely but may instead be offset by some amount. Further, although the diagram shows rectilinear photonic crystals, for some embodiments it may be preferable for the photonic crystal to be some other shape. Though the two photonic crystals are shown stacked in FIG. 6, two or more different kinds of photonic crystals may be configured side-by-side in order to capture a broader range of incident electromagnetic frequencies than could otherwise be captured with only one photonic crystal.

In another embodiment of the solar energy converter, shown in FIGS. 7a and 7b, the wavelength converting material 702 is arranged inside a radial multi-layered structure 704 comprising alternating concentric layers of a first dielectric material 706 and a second dielectric material 708. As is described in reference to FIG. 3a, the dielectric constants and thicknesses of the layers are chosen such that the radial multi-layered structure 704, which acts as the concentrator, forms a dielectric omnidirectional reflector as described in Fink. FIG. 7a shows a cross-section of the radial multi-layered structure and FIG. 7b shows a side-view of the solar energy converter having a radial multi-layered structure.

Light rays 710 incident on the radial multi-layered structure 704 having a frequency outside the band-gap 106 are transmitted through the radial multi-layered structure 704 and a portion of this light is absorbed by the wavelength converting material 702. Light 712 that is subsequently emitted by the wavelength converting material cannot propagate outside the radial multi-layered structure 704 and travels to the edges of it, where the light may be converted to another form of energy by energy conversion devices 712 and 714. Although FIG. 7b shows energy conversion devices 712 and 714 on both ends of the multi-layered structure 704, in other embodiments there may be an energy conversion device at only one end, and in other embodiments the energy conversion device may not be necessary. A radial multilayer waveguide structure is described in U.S. Pat. No. 6,603,911 entitled OMNI-DIRECTIONAL MULTILAYER DEVICE FOR ENHANCED OPTICAL WAVEGUIDING which is incorporated herein by reference. However, in the patent referenced above, light is confined to the core of the multilayer device, whereas in the embodiment shown in FIGS. 7a and 7b this is not necessarily the case.

Although the embodiment described above in reference to FIGS. 7a and 7b describes a radial multilayered structure, in another embodiment the substantially concentric layers may be rectilinear in cross-section, or the cross-section may have some other shape. Further, although the embodiment described above has concentric layers, in other embodiments the layers may slightly-non concentric. FIG. 7a shows a structure having a core and three outer layers, but in other embodiments other numbers of outer layers may be desirable. The waveguide need not be a multi-layered structure but can instead be some other photonic crystal waveguide, such as the one shown in FIG. 4. A photonic band-gap fiber having fluorophores is described in U.S. Pat. No. 6,470,127 entitled PHOTONIC BAND-GAP LIGHT-EMITTING FIBERS which is incorporated herein by reference.

Figure 8:
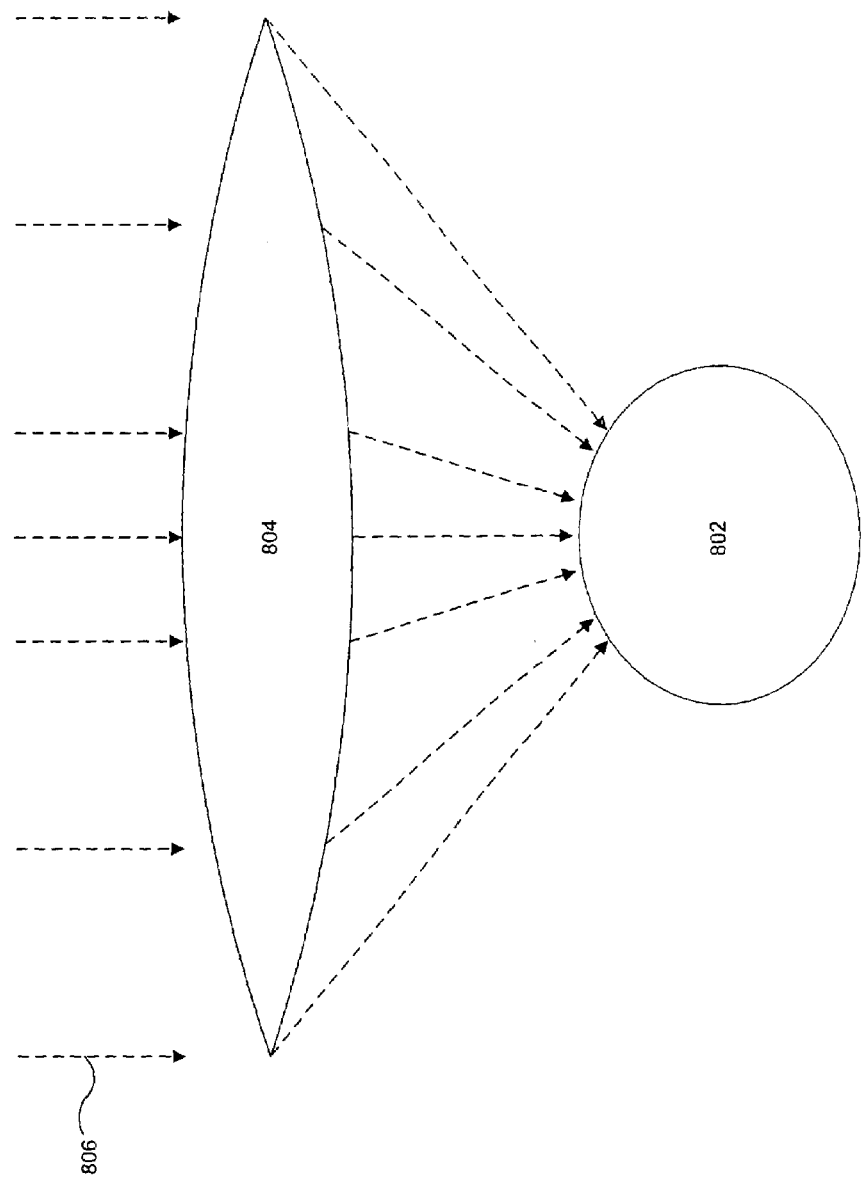
FIG. 8 is a diagram showing a cross-section of a waveguide concentrator with lens for focusing light to the waveguide.

In another embodiment, shown in FIG. 8, the waveguide 802 may include a lens 804 for focusing light 806 onto the waveguide 802. In other embodiments, the element that directs light onto the waveguide may be a mirror or a diffractive element. The embodiment in FIG. 8 shows one waveguide and one lens as an exemplary embodiment, but one skilled in the art could readily extend the configuration in FIG. 8 to more than one waveguide and/or more than one device for directing light onto the waveguide or waveguides.

Figure 9:
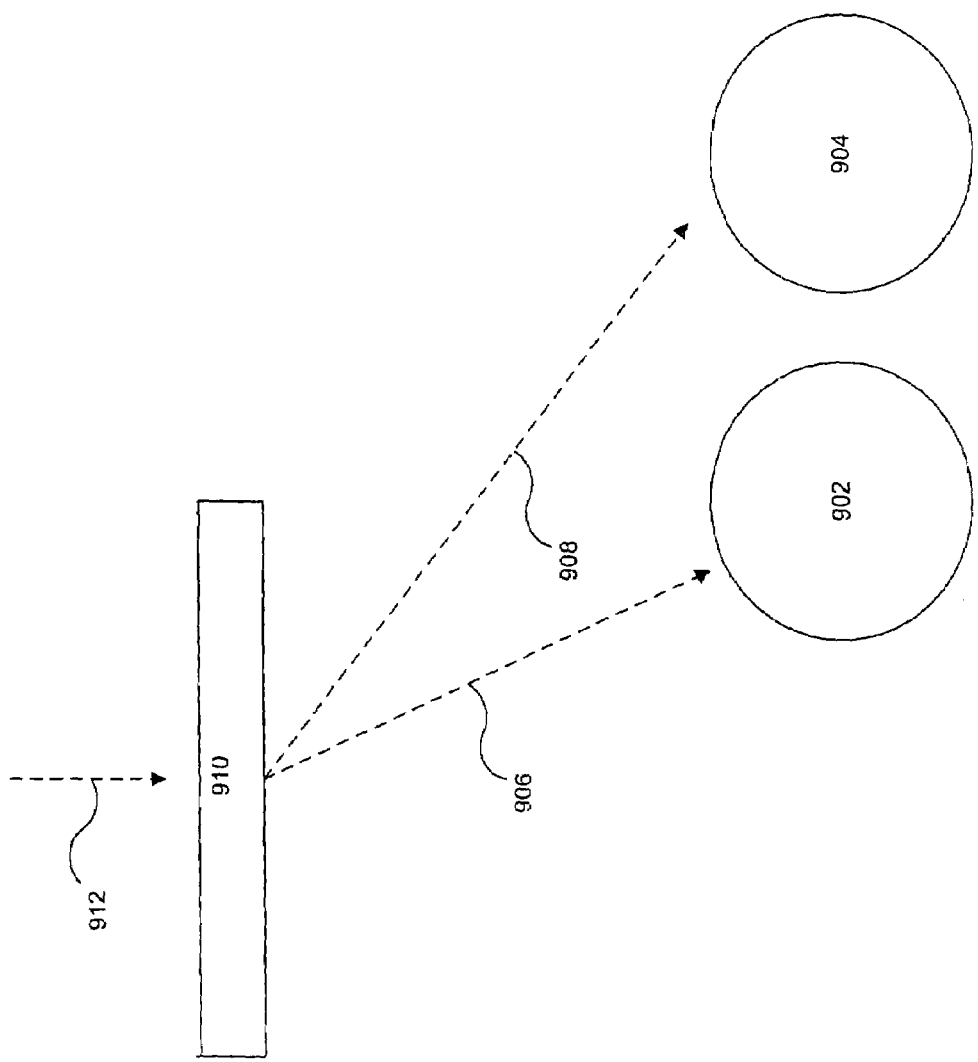
FIG. 9 is a diagram showing a diffractive element directing light rays to two waveguides.

In the case of a diffractive element, shown in FIG. 9, a first waveguide 902 and a second waveguide 904, each waveguide having wavelength converting material with different absorption spectra, may be positioned such that the light incident on each waveguide, 906 and 908, have frequencies that overlap with the absorption spectrum of the wavelength converting material in the waveguides. The diffractive element 910 diffracts light of different wavelengths at different angles relative to the element and the waveguides 902 and 904 are positioned with respect to the diffractive element such that light incident on each waveguide overlaps with the absorption spectrum of the wavelength converting material in the waveguides. The embodiment may be extended to include more than two waveguides and other elements such as lenses, mirrors, or other optical elements for directing the electromagnetic energy to the waveguides.

The embodiments above describe devices having energy conversion devices on two sides of the concentrator. However, in some cases it may be desirable to have energy conversion devices completely surrounding the concentrator, and in other cases it may be desirable to have some other configuration of energy conversion devices relative to the concentrator. The output surface(s) of the concentrators may incorporate energy conversion devices (such as photocells) to generate electricity, or may utilize the energy in photonic form (e.g., for illumination or other applications).

While the exemplary embodiments of FIGS. 1-9 are presented with reference to optical systems and terminology, those skilled in the art will recognize that at least a portion of the devices and/or processes described herein can apply to other types of systems, including UV, IR, RF, X-ray, or other electromagnetic elements, processes, or systems.

The foregoing detailed description has set forth various embodiments of the devices and/or processes via the use of block diagrams, diagrammatic representations, and examples. Insofar as such block diagrams, diagrammatic representations, and examples contain one or more functions and/or operations, it will be understood as notorious by those within the art that each function and/or operation within such block diagrams, diagrammatic representations, or examples can be implemented, individually and/or collectively, by a wide range of hardware, materials, components, or virtually any combination thereof.

Those skilled in the art will recognize that it is common within the art to describe devices and/or processes in the fashion set forth herein, and thereafter use standard engineering practices to integrate such described devices and/or processes into elements, processes or systems. That is, at least a portion of the devices and/or processes described herein can be integrated into an optical, RF, X-ray, or other electromagnetic elements, processes or systems via a reasonable amount of experimentation.

Those having skill in the art will recognize that a typical optical system generally includes one or more of a system housing or support, and may include electrical components, alignment features, one or more interaction devices, such as a touch pad or screen, control systems including feedback loops and control motors (e.g., feedback for sensing lens position and/or velocity; control motors for moving/distorting lenses to give desired focuses). Such systems may include image processing systems, image capture systems, photolithographic systems, scanning systems, or other systems employing optical, RF, X-ray or other focusing or refracting elements or processes.

While particular embodiments of the present invention have been shown and described, it will be understood by those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "leaving" should be interpreted as "having at least," the term "includes" should be interpreted as "includes but is not limited to," "comprise" and variations thereof, such as, "comprises" and "comprising" are to be construed in an open, inclusive sense, that is as "including, but not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

The invention claimed is:

1. An apparatus, comprising:
   a selector region having a first photonic bandgap structure arranged to selectively pass electromagnetic energy in a first wavelength band and block electromagnetic energy in a second wavelength band;
   a trapping region arranged to trap substantially all of the electromagnetic energy in the second wavelength band;
   a conversion region within the trapping region arranged to convert electromagnetic energy in the first wavelength band to electromagnetic energy in the second wavelength band; and
   a converting device coupled to the conversion region to receive electromagnetic energy in the second wavelength band.

2. The apparatus of claim 1 wherein the selector region is defined by a man-made material.

3. The apparatus of claim 1 wherein the selector region is defined by a crystal.

4. The apparatus of claim 1 wherein the trapping region is different from the selector region.

5. The apparatus of claim 1 wherein the trapping region includes a second photonic bandgap structure.

6. The apparatus of claim 5 wherein the first and second photonic bandgap structures are different structures.

7. The apparatus of claim 5 wherein the first and second photonic bandgap structures are spatially discrete.

8. The apparatus of claim 2 wherein the selector region comprises a multilayer structure, said multilayer structure comprising at least two alternating layers of a first dielectric material and a second dielectric material different from the first dielectric material.

9. The apparatus of claim 8 wherein the selector region includes the trapping region, and wherein the conversion region is substantially within a discrete layer of the multilayer structure.

10. The apparatus of claim 8 wherein the first dielectric layer has a first thickness and a first dielectric constant and the second dielectric layer has a second thickness and a second dielectric constant different from the first dielectric constant.

11. The apparatus of claim 10 wherein the first thickness, first dielectric constant, second thickness, second dielectric constant, and total number of layers are chosen to pass substantially all of the electromagnetic energy within a first wavelength band through the selector region and to block substantially all of the electromagnetic energy within a second wavelength band from entering the selector region.

12. A method for:
   admitting a first wavelength band of ambient electromagnetic energy and blocking a second wavelength band of electromagnetic energy; and
   converting electromagnetic energy in the first wavelength band to electromagnetic energy in the second wavelength band at a first location; and
   directing substantially all electromagnetic energy in the second wavelength band to a second location; and
   converting electromagnetic energy in the second wavelength band to another form of energy.

13. The method of claim 12 further comprising:
   admitting a third wavelength band of ambient electromagnetic energy; and
   converting electromagnetic energy in the third wavelength band to electromagnetic energy in a fourth wavelength band at a third location.

14. The method of claim 13 wherein the second location is different from the fourth location.

15. The apparatus of claim 1 wherein the selector region includes a dielectric omnidirectional reflector.

16. The method of claim 13 further comprising:
directing electromagnetic energy in the fourth wavelength band to a fourth location.

17. The method of claim 16 further comprising:
converting electromagnetic energy in the fourth wavelength band to another form of energy.

18. The method of claim 12 wherein the ambient electromagnetic energy includes solar energy.

19. The method of claim 12 further comprising:
directing the first wavelength band of ambient energy to the first location.

20. An apparatus, comprising:
means for admitting a first wavelength band of ambient electromagnetic energy and blocking a second wavelength band of electromagnetic energy;
means for converting electromagnetic energy in the first wavelength band to electromagnetic energy in the second wavelength band at a first location;
means for directing substantially all electromagnetic energy in the second wavelength band to a second location; and
means for converting electromagnetic energy in the second wavelength band to another form of energy.

21. The apparatus of claim 20 further comprising:
means for admitting a third wavelength band of ambient electromagnetic energy; and
means for converting electromagnetic energy in the third wavelength band to electromagnetic energy in a fourth wavelength band at a third location.

22. The apparatus of claim 21 further comprising:
means for directing electromagnetic energy in the fourth wavelength band to a fourth location.

23. The apparatus of claim 21 further comprising:
means for converting electromagnetic energy in the fourth wavelength band to another form of energy.

24. The apparatus of claim 20 further comprising:
means for directing the first wavelength band of ambient energy to the first location.

25. The apparatus of claim 21 wherein the means for admitting a first wavelength band of ambient electromagnetic energy and blocking a second wavelength band of electromagnetic energy and the means for admitting a third wavelength band of ambient electromagnetic energy share a plurality of dielectric layers.

* * * * *